(12) United States Patent
Spotti

(10) Patent No.: US 10,308,446 B2
(45) Date of Patent: Jun. 4, 2019

(54) HANDLING SYSTEM WITH INDEPENDENT AND COORDINATED SHUTTLE, FOR INDUSTRIAL AUTOMATION

(71) Applicant: VISMUNDA SRL, Padua (IT)

(72) Inventor: Davide Spotti, Trieste (IT)

(73) Assignee: VISMUNDA SRL, Padua (IT)

( * ) Notice: Subject to any disclaimer, the term of this patent is extended or adjusted under 35 U.S.C. 154(b) by 0 days.

(21) Appl. No.: 16/076,893

(22) PCT Filed: Feb. 28, 2017

(86) PCT No.: PCT/IB2017/000184
§ 371 (c)(1),
(2) Date: Aug. 9, 2018

(87) PCT Pub. No.: WO2017/149377
PCT Pub. Date: Sep. 8, 2017

(65) Prior Publication Data
US 2019/0047799 A1    Feb. 14, 2019

(30) Foreign Application Priority Data
Feb. 29, 2016    (IT) .................. 102016000020592

(51) Int. Cl.
*B65G 54/02*    (2006.01)
*B65G 35/06*    (2006.01)

(52) U.S. Cl.
CPC ............ *B65G 54/02* (2013.01); *B65G 35/06* (2013.01)

(58) Field of Classification Search
None
See application file for complete search history.

(56) References Cited

U.S. PATENT DOCUMENTS

| | | | |
|---|---|---|---|
| 7,458,454 B2 * | 12/2008 | Mendenhall | B65G 35/06 198/377.02 |
| 8,616,134 B2 * | 12/2013 | King | B60L 13/003 104/284 |
| 9,292,018 B2 * | 3/2016 | Hanaka | B61L 25/026 |
| 9,300,181 B2 * | 3/2016 | Maeda | H02K 5/128 |
| 9,376,271 B2 * | 6/2016 | Fujio | B65G 47/962 |
| 9,708,131 B2 * | 7/2017 | Fujihara | B65G 47/22 |

* cited by examiner

*Primary Examiner* — Kavel Singh
(74) *Attorney, Agent, or Firm* — Egbert Law Offices, PLLC

(57) ABSTRACT

A handling system with independent and coordinated shuttles for industrial automation, of the LSM moving coils drive type, wherein multiple shuttles with on-board coils act on a rail with permanent magnets in an independent but coordinated way, synchronous and/or asynchronous with respect to each other, with a high level of speed, precision in positioning and versatility of use. The system is particularly suitable for the automated machining of flat semi-finished products such as photovoltaic cells, printed circuits and other circuit boards or for the transport and filling of containers such as phials or flacons.

8 Claims, 11 Drawing Sheets

Figure 9E:
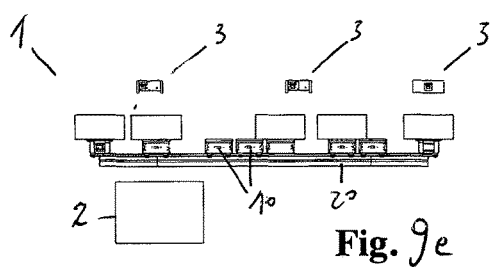

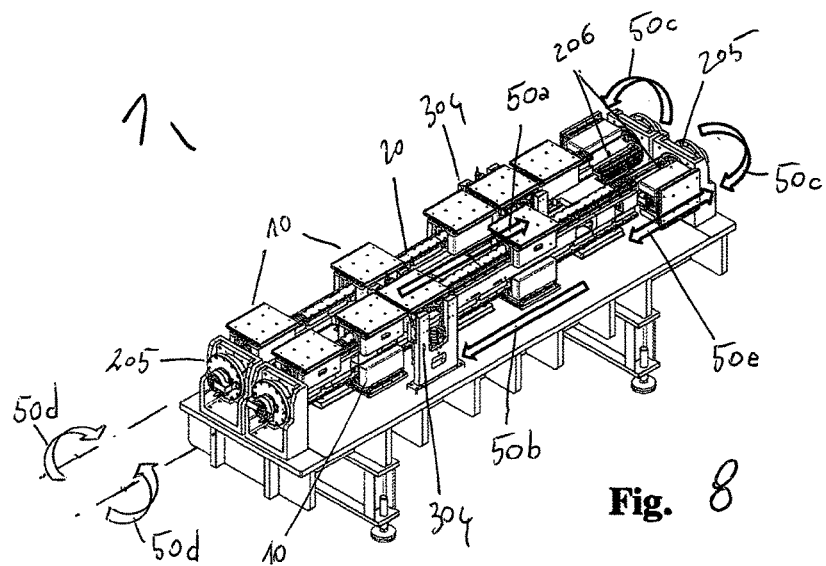
Fig. 8
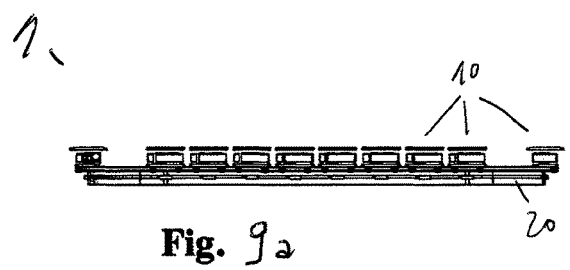
Fig. 9a
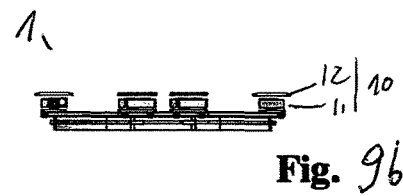
Fig. 9b
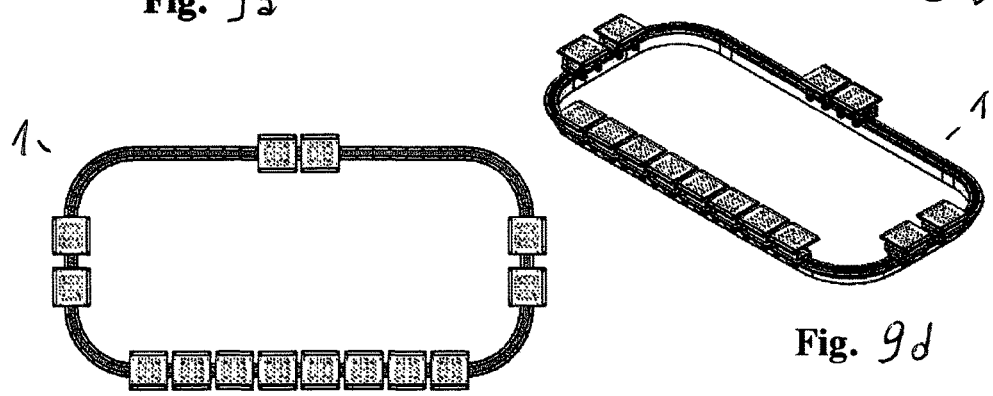
Fig. 9c
Fig. 9d

HANDLING SYSTEM WITH INDEPENDENT AND COORDINATED SHUTTLE, FOR INDUSTRIAL AUTOMATION The present invention relates to a handling system with independent and coordinated shuttles, for industrial automation, with a high level of speed and precision in positioning and great versatility of use.

FIELD OF THE INVENTION

The invention finds particular but not exclusive application in the field of modern automated equipment for the production and/or assembly for the industry, or industrial automation, with the need for large production volumes and great precision of the working processes; as a non-exhaustive example, the invention is particularly suitable for the automated machining of flat semi-finished products such as photovoltaic cells, printed circuits and other circuit boards or for the transport and filling of containers like phials or flacons.

Various solutions for the automatic handling of materials, in the form of crude components or printed elements, semi-finished products or finished products are widely known and have been used for years in factories, in production workshops and in warehouses. Depending on the type of material to be handled and on the specific working process or assembly planned, various technical solutions are available on the market and are provided with a characteristic degree of complexity, flexibility of use or accuracy in positioning. For example, one should remember the simple conveyor belts and rotary tables or, conversely, the modern integrated electromagnetic drive systems with automated control wherein multiple coordinated vehicles, which are also called shuttles or movers, slide on a rail provided with sensors; such vehicles are intended to individually carry the semi-finished products and also prearrange them in an optimal way in correspondence of the workstations. The discipline that studies the interaction between mechanical engineering, electronics and computer engineering for the purpose of automating industrial production is generally called mechatronics and belongs to automation engineering.

It is evident that the various handling systems provide different functionalities, with a different degree of accuracy and versatility of use, being thus chosen depending on the cost and on production requirements. However, the operators of the sector know that even the most evolved and automated systems have some problems concerning positioning precision and repeatability; moreover, sometimes a poor duration and little overall reliability was found in such complex systems, generally due to malfunctioning of a single component. Furthermore, in automated rail systems, the communication between a single shuttle and the centralized control system is sometimes difficult, little effective and/or not reliable, as it also happens in the presence of systems provided with multiple shuttles having different missions.

In principle, it is also known and desirable that the control system intended for the overall management of an integrated handling system is of the simple and robust type, flexible, easy to be maintained and modified and also easy to be interfaced and/or synchronized with external operating units, like single automated workstations; moreover, nowadays safety functions, such as of the anti-collision and anti-accident type, must be integrated in the systems with shuttles on a rail. Therefore, the various industrial handling systems have very diversified characteristics and costs with respect to each other; in particular, such costs must be assessed depending on the overall convenience of the system. The amount of the investment, in fact, comprises the total value of the new system but also the operating costs and the maintenance costs considered over its entire useful life.

All this considered, some considerable problems were found in the most used known and conventional solutions. Mainly, one should remember the conveyor belts where on the same belt section the pieces or the trays move with a regular pace arrangement, or continuously, in any case all according to the same law of motion; it is also known that the synchronization of different belt sections imposes many sensors and many actuators and/or pacers. Moreover, a considerable energy absorption has been observed for the movement of useless sections or members, that is to say, not necessary for a specific working process. In general, all the handling solutions based on conveyor belts or rollers feature slipping and pivoting of the pieces or trays with low precision, that is to say, little positioning accuracy and repeatability, if not assisted by other accessory systems; furthermore, the problem of lack of opposition or support rigidity is known. Finally, in these systems the problems of sequential contamination of the successive pieces on sections of contaminated belt are also known, for example in the case of breaking or spilling, and high wear with the need for frequent adjustments, maintenance and replacements; to this purpose, for example, it has been observed that the breaking or replacement of only one belt normally leads to the stop of the whole handling system.

The above-mentioned disadvantages, in principle, can also be observed on handling systems with pallets on belts, with chains or pilgrim process. The known rotary table systems, on the other hand, feature during the operation some variable offsets which are difficult to be kept stable in time, in addition to said sequential contamination of the successive pieces arranged on the contaminated sections, to wear, to frequent maintenance; furthermore, in said systems there is more complexity in the operations of loading and unloading of said table.

In modern industrial handling one also uses linear units with gear wheels and/or worm screws where the trolley supporting the working processes is translated along a rectilinear rail, for example having a corresponding trapezoidal or similar profile for the purpose of stability; such solutions require additional driving means, for example a rotary electric motor, and also require a high level of maintenance. Among the others, one should remember the linear units with ball recirculation sliding, which require continuous lubrication. More generally, it has been observed that the linear units of the conventional type are suitable for isolated applications but not for integrated handling systems in which multiple shuttles simultaneously perform different missions, being expensive and limited in their versatility of use.

Among the systems with vehicles moving on tracks, or rails, the autonomous drive self-propelled trolleys are known, which are also called vehicles or shuttles, they being individually power-operated and mounted on a track of the substantially passive type; therefore, in such a system the movement of said vehicles is coordinated by means of a centralized logic unit connected to each motor. The power supply of each vehicle occurs with conventional wiring or with movable contact systems, of the type with conductive wheels or brushes on an electrified track. More evolved solutions are also known in which each vehicle is self-powered with accumulators and control, too, occurs by means of wireless systems; for example, one should remember the integrated and modular system with independent shuttles with accumulators called Montrac, by the Swiss company Montratec AG—www.montratec.com, which today belongs to the German group Schmid GmbH.

The industrial automation sector has recently proposed high precision handling systems, which are based on electromagnetic drive linear synchronous motors, which are also known by the acronym LSM or as linear actuators. Among the most evolved solutions, there are the integrated shuttle systems with on-board permanent magnets; such shuttles, which are not power supplied, slide on rails which integrate over their entire length coils, which are supplied in a selective way, that is to say, electronically controlled for the purpose of the positioning of each vehicle. For example, one should remember the integrated and modular system called XTS by the German company Beckoff Automation GmbH—www.beckoff.com, or the system called MM LITE™ by the American company MagneMotion Inc.—www.magnemotion.com, or even the system called ATS SuperTrak™ by the American company ATS Automation Tooling Systems Inc.—www.atsautomation.com. Such solutions provide substantially passive shuttles, without power supply and therefore without on-board logic and individually translated by attraction by said coils.

Nowadays, the principle of said linear synchronous motor or LSM is also used in the smart shuttle with on-board coils configuration, which is known as moving coils linear motor. In these cases the variable magnetic field is realized by coils integrated in the vehicle, said coils being suitably shaped, supplied and controlled selectively and individually in such a way as to slide on a rectilinear track or stator, which on the other hand integrates over its entire length a linear sequence of fixed modular magnetic plates with alternate polarity, which are also called permanent magnets, not supplied. The concatenation of the permanent magnetic field generated by the fixed magnets in the rail with the variable field generated by the coils on each shuttle depending on the position of the shuttle itself allows to change the law of motion of each shuttle in an independent way. Such a solution is mainly adopted in the automated equipment in which handling occurs with an accurate and precise positioning of a semi-finished product or a tool or operating unit along a rectilinear axis of short length, performing isolated and repetitive missions, that is to say, missions which are not integrated or which are only partially integrated with other working processes. For example, one should remember the modern numerical control working centres, which are also known by the CNC acronym. The systems with on-board supplied coils, called moving coils, therefore, substantially use the LSM drive in an opposite way with respect to the integrated systems in which multiple shuttles with on-board permanent magnets, called moving magnets, are translated along a selectively supplied track, of more complex realization and shape, also in the form of a closed loop circuit.

Said linear synchronous motors used in industrial automation in said isolated solutions, that is to say, LSM moving coils, are mainly of three types: with a single-sided structure, called ironcore, in which the rail is flat and is provided with one single fixed magnetic track on which the slider or mover slides, which integrates coils wound around a core, or with a two-sided structure, called ironless, with a U-shaped rail or track, provided with two frontally symmetrical fixed magnetic tracks inside which the slider or mover integrating the coils slides, or even with a cylindrical or tubular structure. For example, one should remember the linear motors commercially called LMA, LMG and LMS Ironcore by the Swiss company Etel S.A.—www.etel.ch, or the linear motors called ILM and ILF Ironless by the same company.

The present invention aims at realizing an innovative handling system of the integrated and modular type and of easy industrial application, it being totally automated for precision working with large production volumes, where multiple shuttles act simultaneously in an independent but coordinated way in such a way as to simultaneously perform missions different from each other; in particular, the aim consists in advantageously implementing an electromagnetic drive system of the linear synchronous motor type, particularly of the LSM moving coils type with coils on each shuttle and preferably in said single-sided or double-sided type.

PRIOR ART

For the purpose of determining the prior art related to the proposed solution a conventional check was made, searching public archives, which has led to find some prior art documents, among which:
D1: U.S. Pat. No. 6,876,107 (Jacobs)
D2: U.S. Pat. No. 8,616,134 (King et al.)
D3: WO200850760 (Peltier)
D4: US20120145500 (Staunton et al.)
D5: U.S. Pat. No. 5,626,080 (Trenner et al.)
D6: U.S. Pat. No. 8,134,258 (Finkbeiner et al.)

D1, D2, D3, and D4 describe an automated industrial handling system with shuttles that are mobile on a rail, with LSM electromagnetic drive and centralized electronic control; there are many modular and removable shuttles, acting as mobile trolleys or for the fixing and/or the transport of products or materials, substantially of the passive type, they being provided with on-board permanent magnets to be translated like sliding shoes by the coils that are integrated over the entire length in the rail of the smart type, that is to say, intended to supply them selectively to position the shuttles independently of one another; to this purpose position sensors are also provided, which are directly connected to the central control system. In D1 the path of the track is closed and comprises coils above and below to interact with laterally sliding trolleys, like shelves, being provided with an opposite double series of magnets. In D2 the shuttles are provided with angular protrusions which surmount the containment edges of the rail and interact with them facilitating possible changes in direction.

In D3 and D4 the system with moving magnets is subdivided into modular track sections with coils, individually controlled in an independent way by means of a logic unit of the PLC type and readers for linear encoders, each shuttle being provided with references of the linear encoder type sufficiently long to enable localization also during the passage to the following section; the global management of the system is ensured by a central controller directly connected to the single sections. For the purposes of control, D4 describes an induction system intended to supply each shuttle individually and wirelessly, where the power is obtained from the rail by means of two coils positioned on the shuttles on the sides of the permanent magnets.

D5 proposes an integrated system with independent shuttles on a rail for the industrial transport of semi-finished products, or finished products; the shuttles are autonomous vehicles, being motorized and supplied wirelessly, which slide on a simplified rail which can include long and articulated paths for the purposes of transport. Every vehicle is associated in the upper part with a plane or tray for materials, it being constrained and rotatable by means of mobile joints.

D6 proposes an electromagnetic drive linear electric motor of said LSM moving coil type, wherein the trolley with coils translates back and forth on the rail with permanent magnets being constrained to two rails differently oriented with respect to each other, that is to say, one upwards and one on the side, in such a way that the plane or tray associated with said trolley, being constrained to both said rails, can be configured and articulated in multiple supporting positions such as vertical or horizontal; said plane or tray comprises multiple thin-walled elements hingedly constrained to each other to rotate, also partially, in an autonomous way for the purpose of the specific working process.

In conclusion it is reasonable to consider as known:

automatic industrial handling systems of the mechanical type, driven by an electric motor and with conventional continuous translation means such as conveyor belts, rollers, pilgrim process mechanisms and rotary tables.

an integrated system of the type with autonomous shuttles, that is to say, motorized and independent on a passive rail, with an on-board accumulator as well, intended to handle materials on a tray along loop or articulated paths;

an integrated electromagnetic drive LSM system with multiple shuttles provided with on-board permanent magnets which are moved along a rail that integrates over its entire length selectively controlled and supplied coils, also with a loop path for continuous and multistation machining cycles;

an isolated electromagnetic drive LSM system of the moving coils type wherein a shuttle, provided with selectively supplied coils, slides along a rectilinear rail comprising the permanent magnets, it being of limited length as for example occurs in the modern CNC machining centres wherein the shuttle acts as a mobile support for the product to be machined or for the tool and is directly connected via cable for the purpose of power supply and control;

a metallization system for electronic circuits or photovoltaic cells wherein the main handling occurs with conveyor belts, intended to draw near and align the semi-finished products to the workstation, in rows, which then are picked up and/or locally translated for the purposes of printing also by means of linear motors, wherein the stroke of the sliding shoe is limited to said translation and the printing alignment and/or positioning occurs by means of mobile arms and/or eccentric lifting systems; systems are also known, which provide the picking up with lifting of the single cell from the conveyor belt for the purpose of printing, from the bottom upwards towards the fixed printhead, by activating a vertical piston, multiple heads and multiple stations is series also being provided.

Drawbacks

In conclusion, we have observed that all the known solutions have some drawbacks or anyway some limits.

First of all, it has been observed that the integrated electromagnetic drive LSM industrial handling systems with multiple shuttles provided with on-board permanent magnets and a rail provided over its entire length with selectively supplied coils, as for example in D1-4, have remarkable control problems and are also little versatile, particularly in the case of articulated configurations. Instantaneous, continuous, constant and always effective communication with each shuttle is necessary to correctly control such a complex system, which is essentially centralized. Therefore, it has been observed that such an aspect is particularly relevant when said shuttles are passive, that is to say, not powered and without on-board processing and logic capability; one should consider, for example, not driving shuttles but multiple wagons with on-board magnets, that is to say, attracted and/or pushed depending on the commands given to the rail. Particularly, it is known that coordination occurs depending on the position of each shuttle and also that the interaction between the coils and the single shuttle, in order to ensure independent missions, that is to say, isolated with respect to the other shuttles, is difficult. To this purpose, one should remember in these integrated systems some phenomena of electromagnetic interference between close shuttles or even positioning control problems in the passage between independent rail sections.

Secondly, it has been observed that said integrated systems, as in D1-4, are very rigid, that is to say, little versatile, and particularly they are not suitable for articulated configurations; in fact, the operators of the sector know that the making of said rails with selectively supplied coils is complex and expensive in case of small-sized shuttles with precision positioning. In particular, the difficulties of operation in curve are significant since the positioning of the coils with respect to said shuttles is problematic; therefore, such systems allow for limited and simple paths. Nowadays, in the modern continuous production industrial lines there are large production volumes with many automated workstations having different functions; in these cases, due to all the above-mentioned disadvantages, a similar handling system is little flexible and constraining, it being difficult to make complex and variable paths with rail switches as well.

Thirdly, it has been observed that industrial handling systems with independent shuttles on a passive rail, as for example in D5, being self-powered by means of incorporated accumulators, feature particularly complex and expensive shuttles, difficult to be coordinated, with a high level of wear and defectiveness and also not easy to be reloaded; such shuttles, moreover, feature inertias and heavy weights, such parameters being fundamental for the duration and the performance of the whole handling system. It has also been observed that the above-described system generally implies high consumption and low energy efficiency. Therefore, these disadvantages make such a system mainly suitable for the transfer of materials in the assembly lines or for storage, being however little suitable for the automated, consequential and asynchronous precision machining of small-sized semi-finished products as for example occurs in the case of photovoltaic cells and circuit boards or for the filling of phials and flacons.

Fourthly, it has been observed that said integrated solutions, as for example in D1-5, occupy wide spaces and also provide a considerable increase in the space used by every new adopted apparatus. Furthermore, it is known that such solutions imply high investment and maintenance costs as well as high costs related to the spaces occupied by the plant.

Fifthly, it has been observed that said LSM moving coils drive solutions, that is to say, with permanent magnets on a rail and coils on the shuttle, as for example in D6, are extremely reliable and precise in positioning but, however, they are of easy implementation only in the case of simple configurations, substantially of the isolated type wherein the rail is short and rectilinear and wherein one single shuttle or at most a homogeneous group of synchronized shuttles slides; in such cases said shuttle translates back and forth supporting a tray or a tool for automated machining, as for example occurs in assembly lines or in said numerical control working centres, with axial movements of a tool or to translate precisely the element to be machined, without interfering with other vehicles or missions. Such a solution is of difficult implementation where the path to be followed is long, articulated or curved and where multiple shuttles must simultaneously perform missions which are independent but coordinated with respect to each other, that is to say, when the handling system is not of the isolated type but is of the integrated type also with several variables and diverse interactions among shuttles and/or with external means; for example, one should consider an automated continuous production line in which multiple shuttles translate between non-synchronized workstations in order to reduce the time of the cycle and/or the space occupied by the plant.

In more detail as to the control system, it has also been observed that in said isolated LSM configurations there is no need to integrate complex sensors, and the processing of information is also substantially limited. In fact, the operators of the sector know that an isolated LSM system can be easily managed by means of a programmable logic control unit of conventional use; on the other hand, it has been observed that the control solutions of conventional use available on the market, both hardware and software, are not suitable in case of complex LSM drive applications, that is to say, in the integrated industrial handling systems in which multiple shuttles simultaneously perform, on the same rail, missions which are diversified with respect to each other and particularly if they interact in an independent but coordinated way.

Again as to said isolated configurations, based on LSM driving with a shuttle provided with moving coils, it has been observed that said shuttle, individually following short paths, can be easily connected via cable in such a way as to enable its movement without hindrance, correctly supply power to said coils and simultaneously check feedback. In these cases, the reliability of the cables is essential because the power, the electric current flow and the duration with respect to bending stresses are directly dependent on the section and on the quality of the conductor; in fact, sometimes it happens that said cables are a great limit to the maximum accelerations allowed and that they also cause breakdowns or malfunctions. In order to avoid such problems, special high-performance cables are thus used, of the type called high flex long life, which are more expensive than the conventional solutions.

Hence the need for the companies of the sector to find solutions, which are more effective and advantageous with respect to the existing solutions; the aim of the present invention is also to solve the described drawbacks.

Short Description of the Invention

This and other aims are achieved by the present invention according to the characteristics as in the appended claims, solving the above-mentioned problems by means of an innovative handling system (1) with independent and coordinated shuttles for industrial automation, of the LSM moving coils drive type, wherein multiple shuttles (10) with on-board coils (102) act on a rail (20) with permanent magnets (201) in an independent but coordinated way, synchronous and/or asynchronous with respect to each other, with a high level of speed, precision in positioning and versatility of use; the invention is particularly suitable for the automated machining of flat semi-finished products such as photovoltaic cells, printed circuits and other circuit boards or for the transport and filling of containers such as phials or flacons.

Aims

In this way, by the considerable creative contribution the effect of which has allowed to reach a considerable technical progress, some aims and advantages are achieved, solving the main drawbacks pointed out.

A first aim of the invention was to create an innovative handling system, industrially advantageous and long-lasting, of transport with shuttles, which move on potentially variable paths with single independent variable and/or interconnected missions, in a synchronous and/or asynchronous way with respect to the other shuttles and to the stations where said shuttles stop for operations to be carried out according to variable programs and sequences. In particular, it is versatile and of simple configuration, being modular and compact, and is also easy to be integrated into already adopted systems. Every mission can be modified in real time by means of simple software control, without changing or adapting the mechanical components; the shuttles operate freely, without movement restrictions, thanks to the absence of the conventional power supply and communication wiring. Furthermore, the number of the necessary input/output devices is significantly reduced; a system simulator easily integrates the different functions and the different components. Said system has a variable configuration, since it is based on a technology which precisely adapts to different production requirements, with an arbitrary number of shuttles and path of the rail.

A second aim of the invention was to increase the flexibility of use. In particular, the system allows to transport and position the loads precisely, in a wide range of weights and sizes, and also allows to handle different loads simultaneously. The system easily allows to add or remove motors or to combine multiple shuttles coordinating them in the same mission, depending on different production requirements such as, for example, the increase in load-bearing capacity. Moreover, it is possible to easily adjust the speed and the acceleration of the single shuttles, which are independent or which can be grouped by function, and therefore spaced apart with a pace that can be variable. Therefore, said system allows to handle the single shuttles in a synchronous or asynchronous way with respect to each other depending on the planned working sequence, which can thus be variable. Basically, the invention proposes a versatile system in which each motor is individually controlled, in an active or semi-active way, and can also be easily integrated into different, already existing, plants or systems, thus optimizing general efficiency.

A third aim of the invention was to considerably reduce wear and the costs for use and maintenance. In fact, it can be observed that the technology used is based on electromagnetic drive and does not require the use of ball recirculation screws, gears, belts, racks or clamps, which are notoriously subject to wear and malfunction. Moreover, thanks to the high positioning precision, there is no need to compensate for any inaccuracies as, on the other hand, is required in the conventional transport solutions. For example, one should consider the elongation of the chains due to load and wear, the re-tensioning of the toothed belts or the mechanical clearances during the load variations. In particular, there are a significantly reduced number of moving components; the invention provides to move, in addition to the load, only the shuttle comprising the mobile part of the LSM motor. Moreover, it can be observed that energy consumption is reduced with respect to the traditional handling systems for serial production and that the shorter inactivity times provided by the invention, in addition to increasing productivity, also decrease the movements of the shuttles. All this considered, the burdens concerning the operation and the ordinary and extraordinary maintenance of the system were thus reduced; finally, it can be observed that the main components can be cleaned thoroughly and/or washed without removing them.

A fourth aim of the invention was to increase production speed; for example, it is possible to reach, without jerks and with maximum positioning precision, a speed of up to 4 m/s and more, with accelerations of up to m/s$^2$ and more. Moreover, it is possible to perform in any one of the stations, along the entire path, the operations of synchronization with respect to a given law of motion, start and stop. The acceleration profiles can be uniform, that is to say, without jerks, in such a way as to also allow to transport open liquids. Although sometimes the operating cycle includes the stop and the re-start in correspondence of the workstations, said advantageous characteristics allow the system to effectively ensure a working flow as continuous as possible in any case. In fact, the possibility of having secondary controlled axes on the single shuttles, besides simplifying the operations and the equipment in correspondence of each station, allows to perform operations for example of preparation, orientation, holding or release, which are independent but able to be coordinated for each component or group of components transported with respect to what occurs in the single stations. In this way, in addition to said simplification, cycle times are reduced and, as a consequence, production rhythm is advantageously increased, with the other factors remaining unchanged.

A fifth aim of the invention was to occupy a reduced area for the installation of the whole plant. The use of an LSM motor as provided by the invention is effective and advantageous, enabling engineering progress as far as this type of plant or handling system is concerned; more technically speaking, the volume of the equipment is exploited at most because the forward and return path is used and the bends are also used for the transport of active material by means of the independent shuttles. In this way it is possible to reduce the costs related to the machines and to the occupied area as well. Furthermore, it can be observed that the power electronics, the control and the measurement of the movement of the primary driving part, the control of the secondary axes and of the on-board sensors can be integrated in order to be able to make compact and low-cost equipment.

A sixth aim of the invention was to enable a rapid and flexible adaptation to the format of the machined product. Such an advantage is particularly important in the industrial packaging sector; in fact, in high-production plants it is extremely desirable to make a possible change in the format easily and without interrupting the cycle, for example when filling capacity is changed. It is also advantageous that such changes can be made rapidly by changing the parameters of the control program; for this purpose, empirical values or values deriving from previous tests can be saved as sets of parameters that can be recalled at any time, also being interchangeable with applications of the same type. In this way, it is possible to eliminate most of the mechanical adjustments during the operating cycle.

Another aim of the invention was to create a handling system with improved dynamics, with high performance in terms of speed, that is to say, up to 4 m/s and more, and acceleration, that is to say, up to 1 m/s$^2$ and more, it being however controlled with high precision, that is to say, of up to 1 μm. The rapid signal processing and the large bandwidth of the communication protocol, of the type called Fast Ethernet bus, allow to considerably improve the response and the control of the system during use, with respect to the known systems. For example, it is possible to adjust the operating and setting parameters of the system, during use, depending on the different filling levels; moreover, the monitoring of positioning delay prevents damage to the product in case of mechanical malfunctions. Moreover, the limitation of the force and/or the reduction of jerks allow to manage the machining and/or the transfer of the product in an optimal way, in each phase of the cycle and in different points of the path.

A further aim of the invention was to increase safety, reducing volumes; smaller masses like the single shuttles, in fact, are potentially less dangerous. Unlike the LSM systems with independent shuttles, in conventional mechanical systems for example there is generally a conveyor belt operated by a centralized motor unit, therefore the necessary total force is equal to the sum of the individual forces; said total force, therefore, acts along the entire length of the belt also in the case of mechanical malfunctions or errors, or in manual interventions. Such traditional systems generally require power transmission members, like gears or reduction gears or belts and shafts, which as a whole are in movement in a wide space even if the operation actually in progress is of the localized type; it follows that the exposure to risks for operators and maintenance operators or controllers is, therefore, greater with respect to the LSM drive systems in which such a risk is significantly minimized, since each load is actuated by the respective shuttle. In case of a possible impact with an obstacle, one single shuttle is involved. Finally, the invention provides an LSM system with smart shuttles equipped with on-board sensors and individual logic, although they are coordinated, therefore, the possibility of error is further reduced and said safety is increased.

Another aim of the invention was to provide the possibility to use automatic control systems, which are effective and less expensive. In this specific case, in order to implement handling and machining systems with high productivity, and thus with a reduced cycle time, one generally resorts to a large and intensive use of computer vision for inspection, otherwise known as Automated Optical Inspection or by the acronym AOI. Typically, when one wishes to have high resolutions, one provides a technology with matrix cameras, which are equipped with excellent optical resolution but that, however, are expensive and require that the object to be controlled is fixed and motionless in the range of action of the lens of the camera. A system with independent and coordinated shuttles, as in the present invention, can impose in specific sections of the path a law of motion with constant speed in such a way as to enable the use for AOI of line scan cameras which are considerably cheaper, in which the overall image of the transported object/objects is reconstructed with the interpolation of the axis of translation with respect to the frequency of the scanning beam of the camera transverse and perpendicular to the axis of motion of the shuttle. In this way one obtains high control precision with substantially low cost and, there being no need to stop the piece, high productivity.

An additional aim of the invention was to create a constructively compact and light handling system, of the modular type, having considerably low industrial costs.

These and other advantages will appear from the following detailed description of some preferred embodiments, with the aid of the schematic drawings enclosed, whose details of execution are not to be considered limitative but only illustrative.

CONTENT OF THE DRAWINGS

Figure 1A:
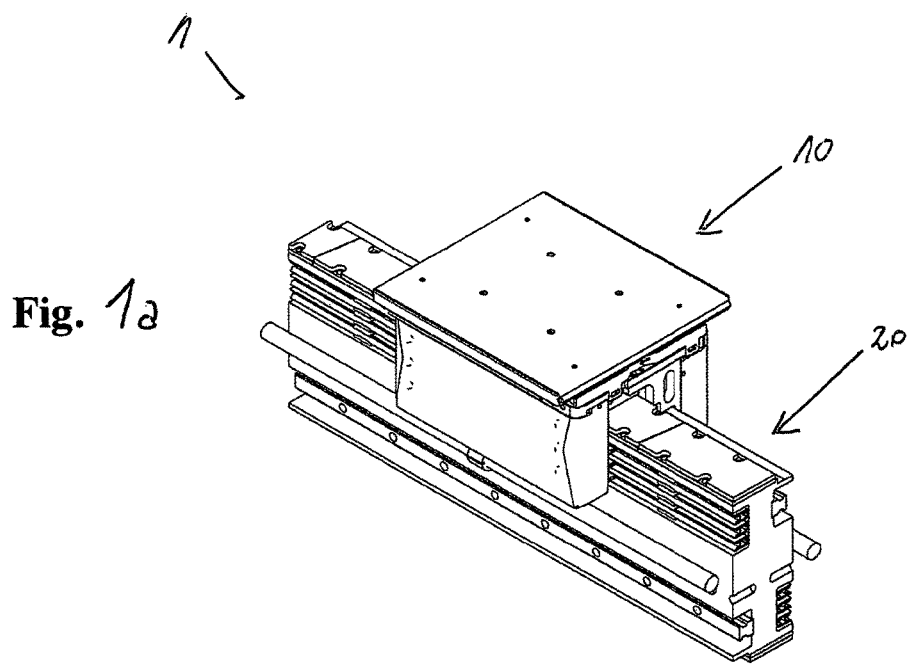
Figure 1B:
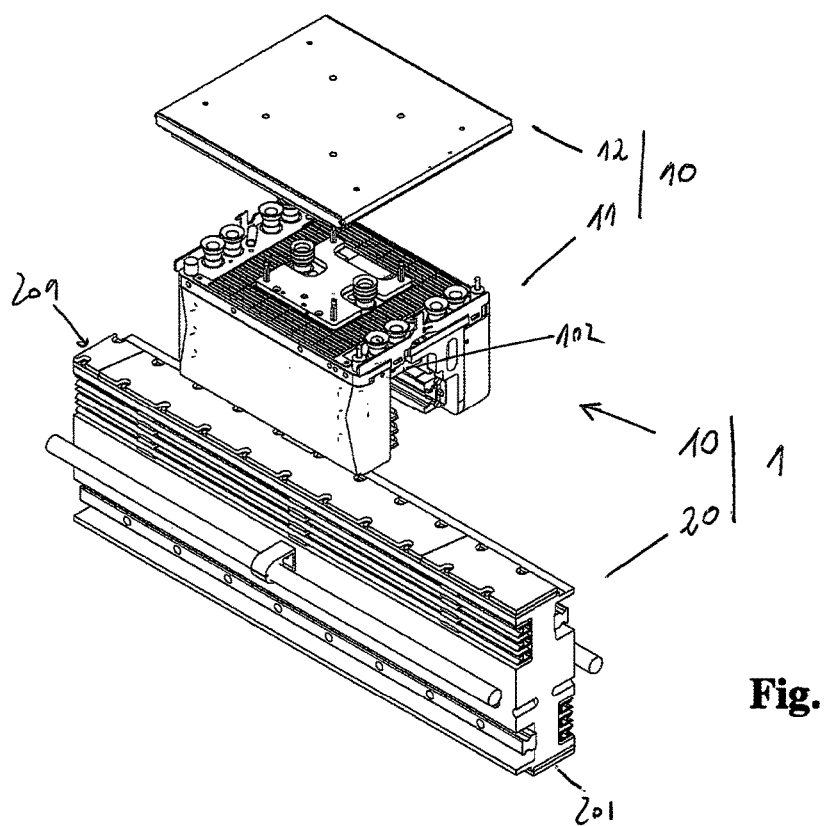

FIGS. 1a-b show, in an axonometric view, the self-propelled sliding shoe and the sectioned portion of rail on which the handling system according to the invention is based, they being represented assembled (FIG. 1a) and separate (FIG. 1b) respectively, wherein a tray for transporting the products is also associated with the self-propelled sliding shoe.

Figure 2A:
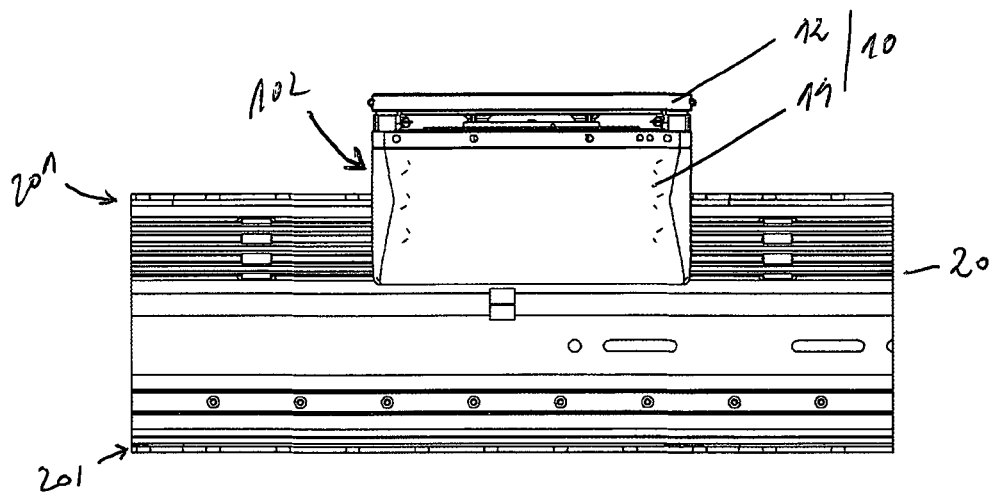
Figure 2B:
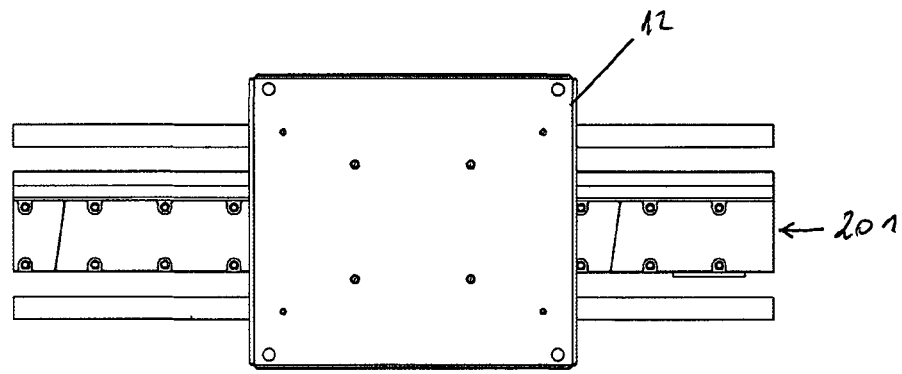
Figure 3A:
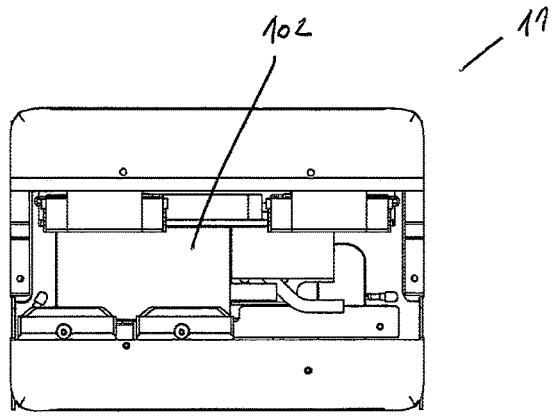
Figure 3B:
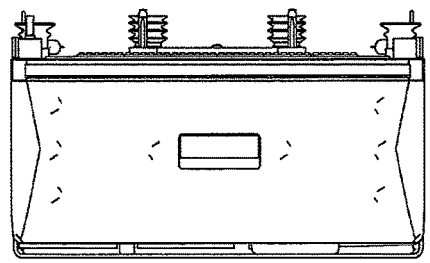
Figure 3C:
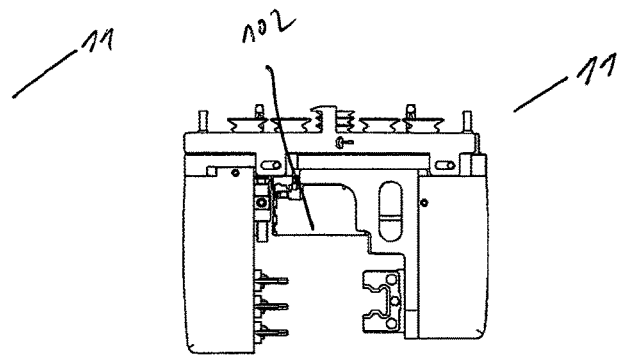
Figure 3D:
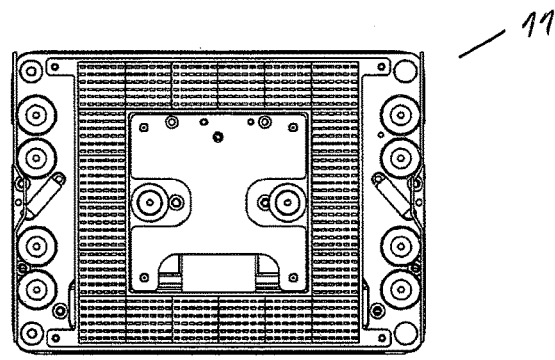

FIGS. 2a-b orthogonally show, from the side (FIG. 2a) and from the top (FIG. 2b), the shuttle and the sectioned portion of rail as in said (FIG. 1a).

FIGS. 3a-d orthogonally show the sliding shoe from the bottom (FIG. 3a), from the side (FIGS. 3b-c) and from the top (FIG. 3d) respectively.

Figure 4A:
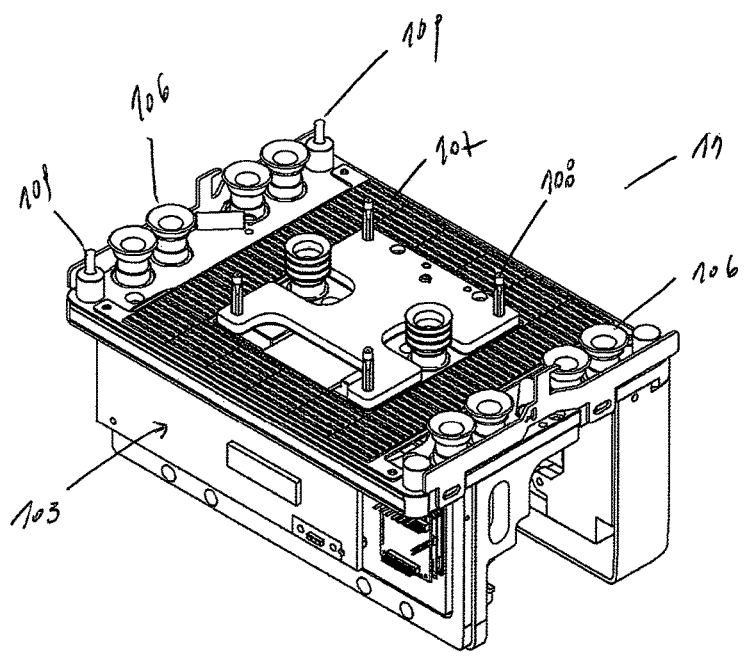
Figure 4B:
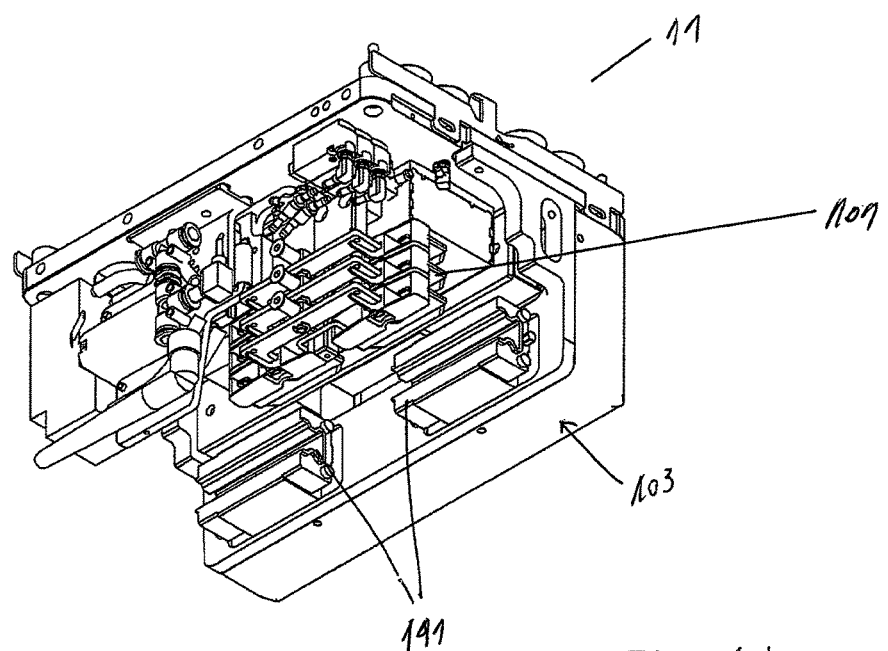

FIGS. 4a-b show the self-propelled sliding shoe in an axonometric view, from the top and from the bottom respectively.

Figure 5D:
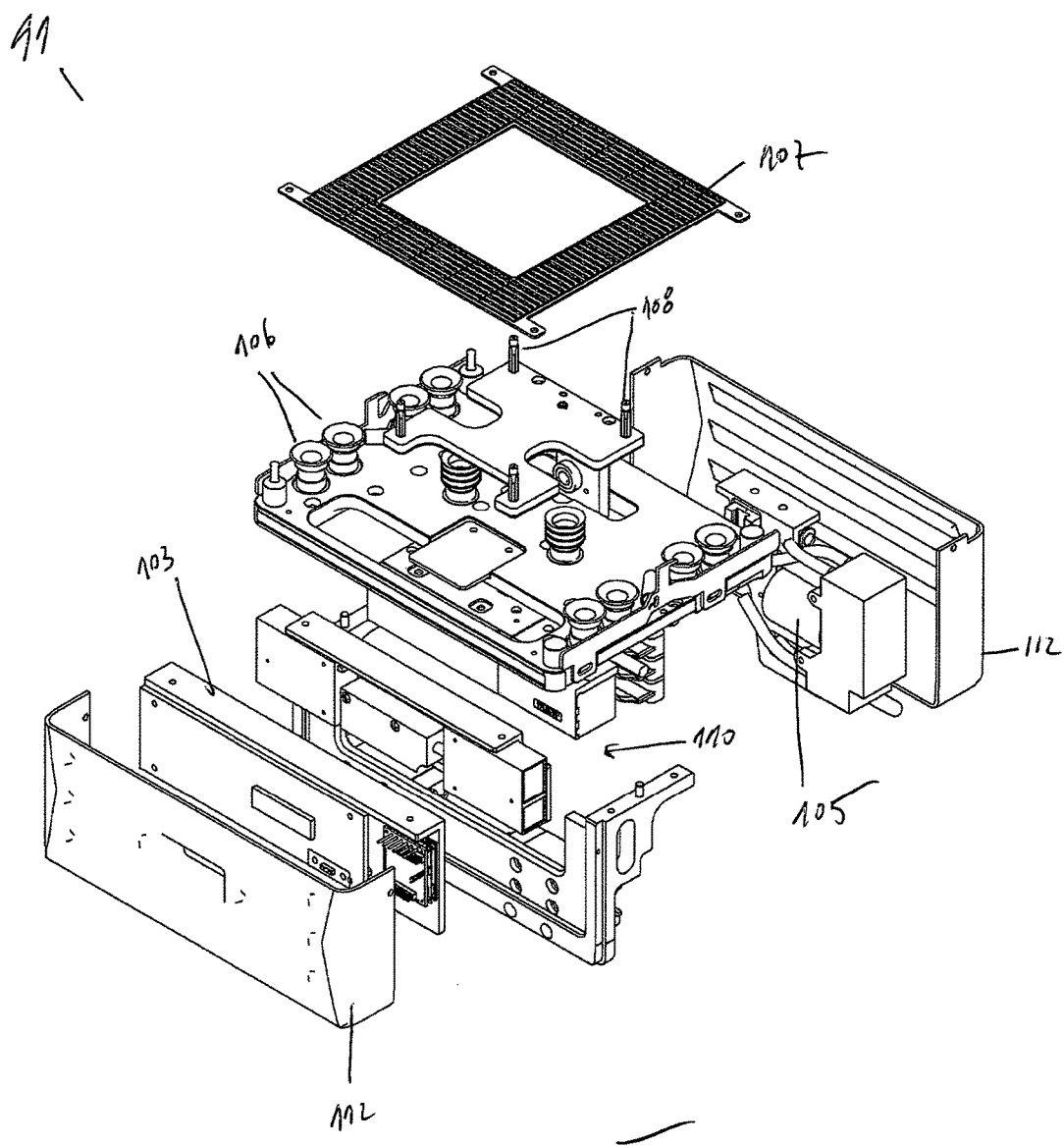
Figure 5B:
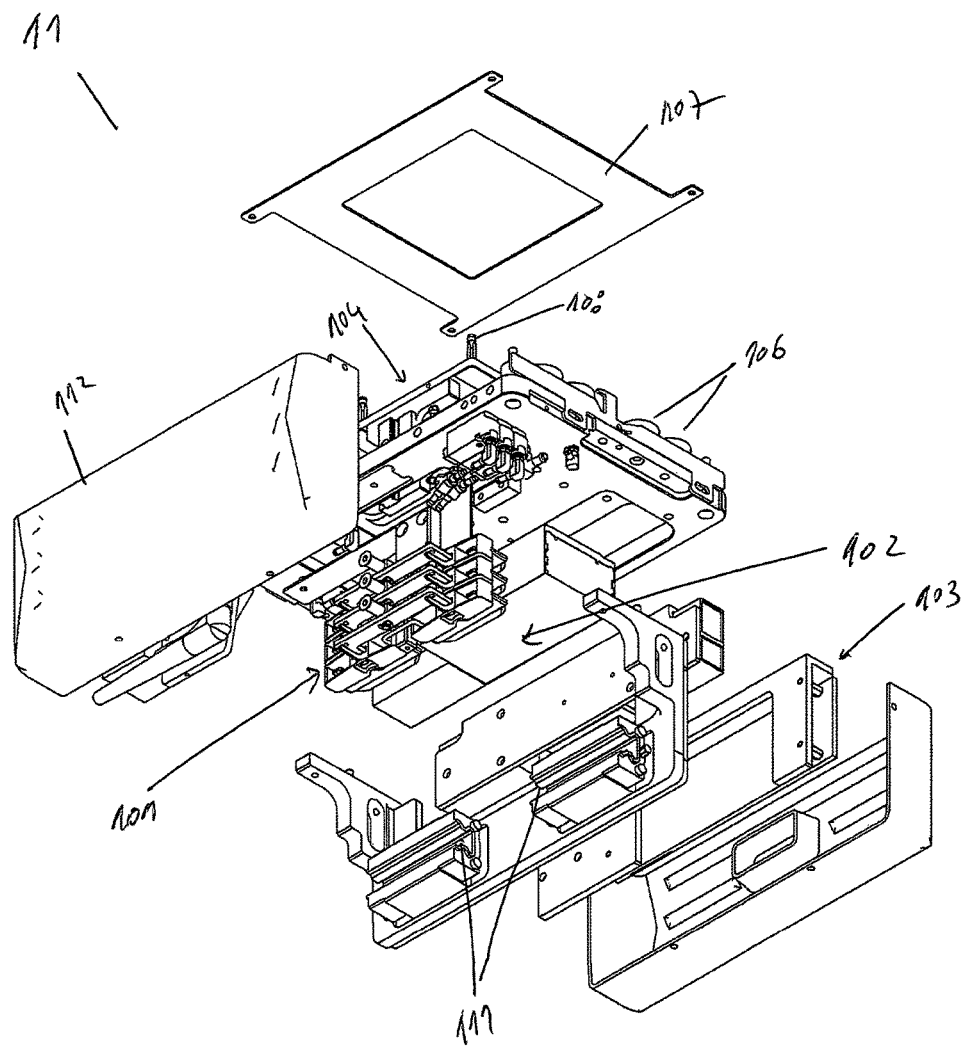

FIGS. 5a-b show, in an exploded axonometric view, the self-propelled sliding shoe as in (FIGS. 4a-b).

Figure 6:
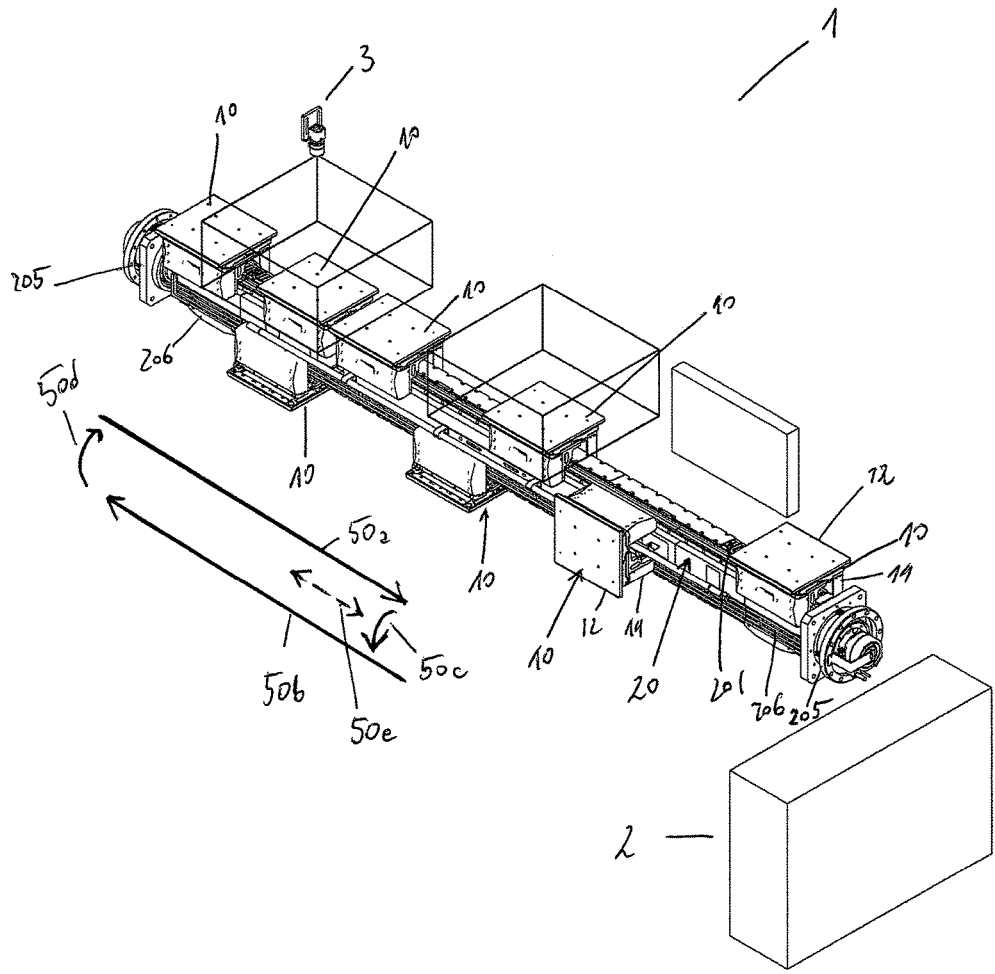

FIG. 6 is an axonometric view of the handling system according to the invention wherein the shuttles comprise trays for flat semi-finished products, and wherein the handling direction, the central server and workstations are schematically represented, in a linear vertical loop configuration with top-bottom rail and lateral overturning of the shuttles; the accessory components are represented in an unrealistic way, also including the electrical and electronic elements necessary for operating the apparatus.

Figure 7A:
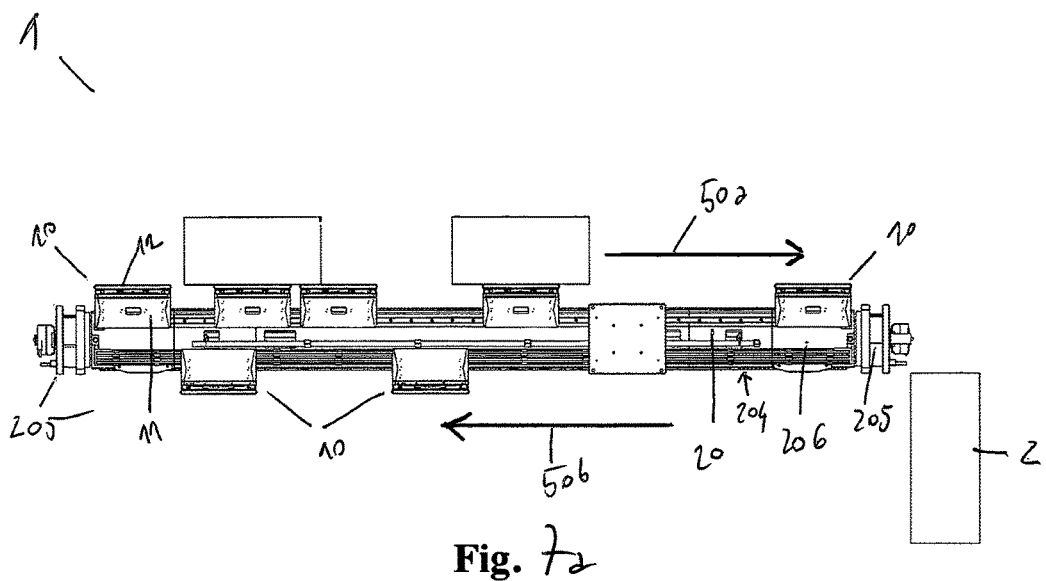
Figure 7B:
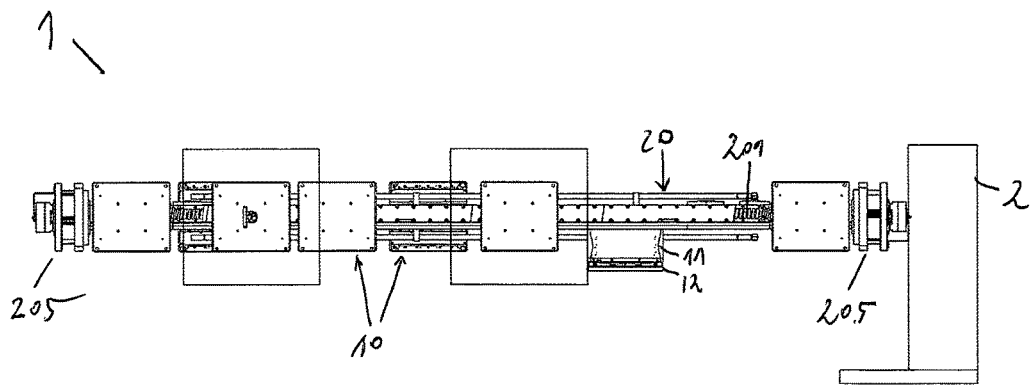

FIGS. 7a-b orthogonally show, from the side (FIG. 7a) and from the top (FIG. 7b), the handling system according to the invention as in (FIG. 6); the accessory components of the system are represented in a schematic way.

Figure 7C:
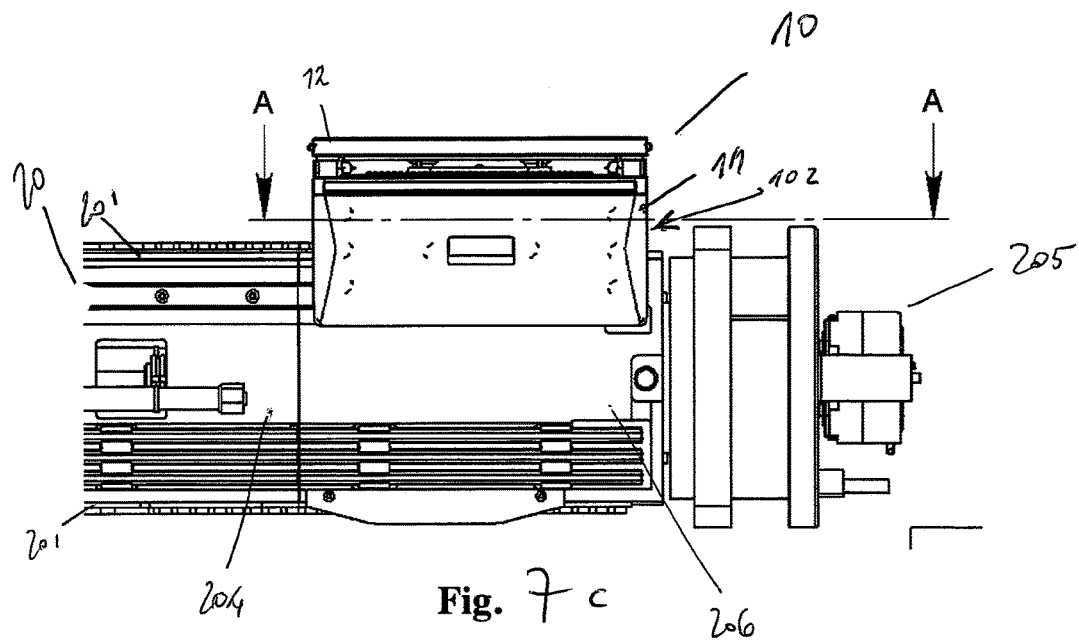
Figure 7D:
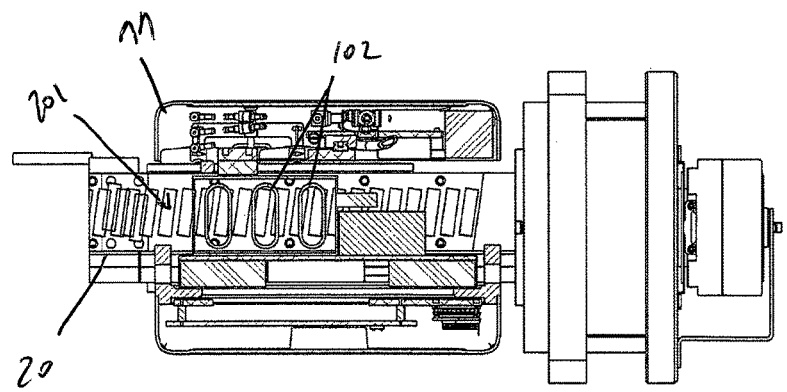

FIGS. 7c-d are detailed orthogonal views of the invention, from the side and in section A-A, with the self-propelled sliding shoe or mover provided with on-board coils represented in correspondence of the permanent magnets which are integrated in the rail.

FIG. 8 is a schematic axonometric view of the handling system according to the invention, in the compact linear configuration with double and adjacent vertical loop, of the top-bottom type with opposite lateral overturnings.

FIGS. 9a-d are schematic orthogonal (FIGS. 9a-c) and axonometric views (FIG. 9d) of the handling system according to the invention, in the simple horizontal loop configuration in the form of a circuit; FIGS. 9e-g are alternative views of the loop configuration also comprising a central server, workstations, vision systems; the accessory components and the central server being represented in a schematic, unrealistic way.

Figure 9H:
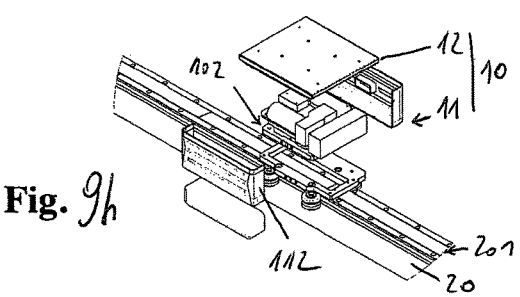
Figure 9F:
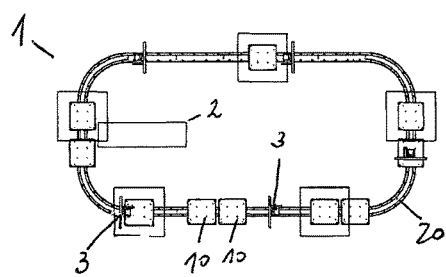
Figure 9G:
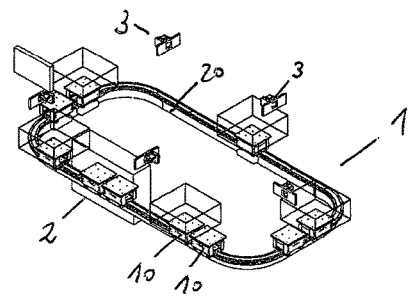

FIG. 9h shows a detail of the variant of the invention with the sliding shoe provided with rollers which slide on guides and induction power supply system.

DESCRIPTION OF AT LEAST ONE EMBODIMENT OF THE INVENTION

With reference to the Figures (FIGS. 1-9) as well, the invention implements said solution of linear synchronous motor LSM drive of the moving coils type in order to create an advantageous modular and integrated system (1) of industrial handling with shuttles; in particular, a system (1) is obtained in which multiple shuttles (10), of the smart type, that is to say, provided with logic on the shuttle processable according to signals received from on-board optical or electromagnetic sensors or received via antenna, translate on the same rail (20) in an independent but coordinated, synchronous and/or asynchronous, way. Each shuttle (10) is mainly made up of two portions:

a lower portion is a self-propelled sliding shoe (11), which is conventionally called sliding shoe or mover, which acts as a slider constrained to the rail (20) in a removable way and comprises all the active means for performing the movements and enabling the secondary drives, according to the secondary working axes, also with the respective control and communication means;

an upper portion is an equipped means (12), otherwise conventionally known as tray, for actuating the secondary working drives, which is supported and/or constrained in a removable way by said sliding shoe (11) in such a way as to support and/or transport the product according to the provided working processes (FIGS. 1-2).

Each sliding shoe (11) is autonomous and independent, comprising on-board coils (102) selectively supplied and controlled for the purpose of electromagnetic drive, also with its logic control unit (103), sensors and means for receiving and transmitting information; therefore, each shuttle (10) is connected wirelessly for power supply and data transmission (FIGS. 3-5).

The rail (20), on the other hand, integrates a continuous series of fixed permanent magnets (201) along its entire length and also integrates absolute reference means of the encoder type which can be used simultaneously by each shuttle (10, 110) and by the central server (2) which acts as a centralized logic unit of control and support of the system (1, 10, 103), for the purpose of instantaneous localization and adaptations (FIGS. 5-7). To this purpose, the invention provides a system of smart sensors, which interact both on a local level and on a global level, which consists of readers and proximity sensors mounted on the shuttle (10, 11) and a linear position transducer or linear encoder, which is fixed in a continuous way on the rail, along the entire path like a fixed and preferably absolute reference. In this way one simultaneously enables the centralized or localized control of the positioning of each sliding shoe (11), also allowing each shuttle (10) active in the system (1) to know the position of the other shuttles; such a solution is particularly useful in case of maintenance, machine downtime or system re-setting and overcomes the known problems of the systems with encoders of the incremental type, which are substantially intended to detect the relative positioning from one point to another. Furthermore, said rail (20) can advantageously integrate the means for the power supply of the shuttles and/or for data transmission.

It can be observed that said shuttle (10) is basically a smart, autonomous drive motor module, that is to say, of the active type, having on board the electromagnetic coils (102) and all the necessary functions for operating in the integrated system (1), that is to say, only requiring power supply and connection for communication. In particular, said active module does not contain moving parts and is not subject to wear, it being substantially a mechatronic unit formed by a fully integrated linear synchronous motor, that is to say, including its own logic control unit and some means for the exact detection of position, of the absolute reference type. Therefore, the arrangement of the on-board supplied coils and the structural configuration of the shuttle allow to realize a ready-to-use handling unit, easy to be removed or added, which allows to optimize control electronics and reduce assembly costs.

The measure of the translation of said active module is autonomous, each shuttle being provided with its own detector of a univocal and absolute reference along the entire rail, like the permanent magnets, that is to say, said rail being of the passive type. Therefore, for each shuttle added or replaced in the system, one can clearly see the advantage of not having to adjust, or calibrate or add any device or equipment for the purpose of control, the instantaneous detection of the position of the shuttle and also of the other connected shuttles being automatic. In this way, the system is always calibrated and tolerances are automatically compensated for. Moreover, it can be observed that, once the mission of each shuttle has been programmed on its logic unit, the system is autonomous, there not being the need for a general control board of each function, but only for a centralized server to which and from which each shuttle sends and receives information. Each shuttle is thus of the lightened type, that is to say, of less than 5000 g, and also the load-bearing structure consisting of the rail and of the respective supports is lightened and of compact size. Finally, the path of the shuttles is easily composable by joining in series straight and/or curved sections of rail and/or overturning means and/or rail switches.

The rail comprises permanent magnets along its entire operational length, adapting in an optimal way to the configuration of said shuttles (10) thanks to the optimized geometrical shape and to the surface preferably of high-resistance anodized aluminum which houses the sliding linear guides for roller or ball bearings, housed on the shuttle, and enables rapid movements and without wear; in this way lubrication is not provided and is not necessary. The insertion or the removal of the single shuttle (10) in the rail (20) is particularly easy both on the main section of translation of the rail or on secondary sections of shunting and maintenance; the translation movement is rapid but gentle, that is to say, without sudden movements, the tolerances being minimum and the elements in contact being preloaded. In more detail, the sliding shoe (11) engages and translates in the rail (20) thanks to the guides with preloaded rollers or balls, substantially acting as an idle bearing; in this way the wear is minimum because the loads and frictions are minimum. The motor, with on-board coils and fixed magnets on the rail, does not have parts in contact or moving parts, therefore the degree of wear is null.

Said shuttle (10) integrates coils (102) which are selectively supplied in such a way as to generate the propulsive force absorbing from the rail (20) the forces of attraction provided by the permanent magnets (201), in particular maximizing the component parallel to the direction of travel of said force and compensating for the other components as much as possible, and thus with minimized loads, friction and wear of the rotating elements (FIG. 7*d*). It can be observed that also in the curved portions of the path such a solution has a high dynamics of movement without generating heat. In particular, the invention provides:

maximum flexibility of movement of the shuttle in both translation directions, along the entire path; the shuttle can brake, accelerate, position itself or exert a force, both when stationary and during motion. It can move independently or, like every linear motor, it can synchronize with other motors, and always without cables, which would reduce its mobility. In the case in which the path is of the loop type the shuttles can circulate continuously following the flow of the product, if necessary with reverse flow portions to facilitate machining, to shorten the cycle time, to reduce the number of workstations or to make the plant more compact;

maximum flexibility of movement for multiple shuttles at the same time; they can translate independently of one another, all referring in any case to an absolute position transducer or encoder. Moreover, they can position themselves with respect to one another also preventing collisions in an automatic way, or they can move in a synchronous way in groups. Such a solution is particularly useful near the workstations in which a group of some shuttles can transit together, stopping at or crossing the station at a predefined speed depending on the specific working process or control, to then proceed in an independent way according to its own mission or repeating said operation many times; therefore, it is evident that the size of each group, in the number and pace between the shuttles involved, can be varied dynamically;

system without limits of configuration of the path and number of shuttles, in such a way as to be adapted in an optimal way to the different application requirements; basically, the only limit in the expansion of the system is intrinsic in the processing capabilities of the central server;

constant and uniform force, also to operate in synergy between the shuttles one behind the other; for example, it is possible to handle in pairs a large-sized product holding it like in a necking, or providing load relief or opposition according to particular operating conditions;

acceleration and centrifugal forces can advantageously be limited, as for example occurs for the transport of liquids in open containers;

the control of the variable inclination of the plane of the tray (12) transported by the sliding shoe (11) or mover, by means of one or more secondary controlled axes on the sliding shoe which are synchronized with the law of motion of the sliding shoe itself, can be advantageously performed.

In more detail as to said shuttle (10), the following means can be included on board:

means for receiving power supply from the rail (20), wirelessly, for example with sliding contacts of the brushes (101, 202) type or without contacts, for example for the transfer of energy by means of electromagnetic induction, to the moving coils (102);

logic control unit (103) for managing the primary movement, or motion control, along the axis of the rail and for the entire path;

driving means (104), or driver units, for managing the drives related to the working processes along the secondary controlled axes further with respect to said primary movement, for example for the grippers or extracting means;

means for making and storing pressure or vacuum for the purposes of the working processes or holding, for example a vacuum pump (105) with pipes or a pump with a Venturi device;

on-board circuit board for managing communication, with access ports for software update and/or for control diagnostics;

antenna for wireless communication, for example for the update of data and/or of the missions and/or of the positions;

collision sensor means for preventing the collision of shuttles in both directions;

transducer means with position sensors (110) of the mobile reader type for the fixed, continuous and absolute reference, which is in the rail, or absolute encoders, for a micrometric control of position;

means for proximity communication, for example of the optical type, with a high transmission speed, as for example in the case in which for the fine positioning in a given position it is advantageous not to wait for the response of the conventional central wireless transmission system;

an equipped means (12) for the machining, holding and stable transport of the product, such as a tray, held and positioned with micrometric precision. The release of said tray can be commanded by the shuttle upon occurrence of given conditions or by the external control system or server.

In particular, it is provided that said means is of the equipped type (12) for the specific operation to be performed, to this purpose comprising, for example:

suction cups or holes made in correspondence of ducts for vacuum for the purpose of holding semi-finished products or finished products, optional grippers;

extracting means;

references for optical reading for the purpose of identification, such as bar codes;

references for optical reading for the purpose of the positioning of working units at the stations where the shuttle stops;

centering elements and angular references for the picking-up by external means;

systems of release of the tray by the trolley in correspondence of external means, such as a workstation or an automatic tray replacement station.

In more detail said rail (20) comprises:

power supply means, with a fixed line of electrical power to be transferred to the moving shuttles, in two alternative ways: by contact (202), with brushes (101) on the shuttles (FIGS. 3-5), or without contact, for example by means of electromagnetic induction, where instead of the brushes there are some specific receivers on the shuttles (FIG. 9h);

fixed permanent magnets (201), for concatenating the magnetic flux of the linear motors of the coils on said shuttles;

fixed magnetic line of the encoder type, for providing the position sensors on the shuttles with an absolute reference;

signal line for data and communication transmission from and to the moving shuttles.

Such an integrated system (1) allows for multiple configurations of the path:

fixed paths or variable paths by means of switches, which are easily allowed by the simplified nature of the rails with respect to the solution with supplied coils, which does not allow it or anyway limits it and surely makes it difficult. For example, it is suitable for linear configurations of the top-bottom type with lateral overturning, simple or coupled in pairs, or for continuous loop configurations in the form of a circuit;

closed or open;

linear, curved or combined, that is to say, both linear and curved;

consisting of only linear portions and joined to each other by the transfer of the shuttles by means of translation or overturning and/or rotation platforms;

along the path there are operating or control stations, which perform operations with the possibility of synchrony with respect to the presence or non-presence of the shuttles or when they transit, following a given law of motion.

The system (1) according to the invention provides, alternatively or in a combined way, a linear and compact configuration of said rail (20) in the form of a vertical loop (FIGS. 6-8) with top-bottom rail and lateral overturning of the shuttles (10), and also provides a simple horizontal loop configuration in the form of a circuit (FIGS. 9a-h). Said overturning can occur with an overturning means (205): the empty shuttle is overturned by 180° degrees (50c-d) by means of a device intended to overturn a whole section of rail (206), including guides, magnets and power supply system by a rotary motor with slip-rings for the control and the continuity of power supply. The control of rotation is performed with an encoder which provides high positioning precision, so as to allow the shuttle (10) to exit when the rotation has been completed and to take a new section of rectilinear rail (50b) placed at a lower level with respect to the forward one (50a), for the return of the shuttle to the initial loading station. Said overturning means (205) can also make partial rotations, for example of 90° degrees (50e) for making said shuttle (10) exit on a section of rail intended for particular purposes such as maintenance or other purposes (FIG. 6).

Said integrated system (1, 10, 20), configured as described above, provides new and advantageous operating possibilities:

precision and accuracy in the positioning of every single shuttle, shuttles moving in an independent but coordinated way, management and communication of the missions from the central level to every single shuttle, management and execution of the mission autonomously by the single shuttle, both in terms of movement and in terms of control of the movement and/or working axes on the shuttle, each shuttle acts from time to time as a master or as a slave, depending on the particular traffic situation or on the particular mission or also in case of specific encodings or occurred and detected accidents, each shuttle can simultaneously carry out different missions, for example with a specific path, operating cycle, number of stops, each shuttle can carry out operations according to assigned logics independently of whether it is moving or it is stationary, in the queue at a workstation or being machined in the latter.

The whole integrated system (1) is coordinated by a centralized control system consisting of a central server (2) provided with programs which are intended to superintend overall management, it being able at least to:

send and receive information to and from the shuttles;

hold the details of the possible missions for the shuttles;

assign missions to the single shuttles with, for example, specific destinations, laws of motion, operativeness of the secondary axes;

receive progress states from the shuttles;

synchronize events and operations, for example between shuttles and stations;

control and check the goodness or quality of the operations performed;

control and store the progress of the working processes, for example with datalog and/or data warehouse and/or system statistics, overall diagnostics and safety and alarm management.

Such a configuration of the system (1) and shuttles (10) can also easily include special shuttles, that is to say, intended to perform diversified missions, with particular and different purposes with respect to the other shuttles but with the same movement and interaction logic.

In practice it has been ascertained that said handling system (10) with independent and coordinated shuttles (1) achieves a high level of precision in positioning and great versatility of use.

Said system (1) is suitable for the automated machining of flat semi-finished products, or non-flat semi-finished products or cylindrical containers for filling held by suitable grippers or anchorage tools controlled by holding or release drives on the shuttle itself. The mover or self-propelled sliding shoe (11) with moving coils is equipped with on-board intelligence which provides management autonomy, even when coordinated by a central control system, and the movement of accessory controlled axes on the mover and supplementary to the motion control of the advancement on the rail.

Such a solution allows to manage interstation operations in a production plant with workstations, in a non-synchronous way as well, if necessary during the movement or the wait before reaching a station as it happens, for example, in the case in which one provides the lifting or the inclination of working surfaces, trays, containers or flacons, or also if there is the translation and/or rotation of operating axes on the shuttle, with the possible activation of pressure or vacuum on board. It has been observed that these possible system features nowadays are impossible to be obtained by means of the systems with shuttles of the moving magnets type, or inexistent in the known systems or anyway very expensive to make. The present invention optimizes and integrates the motion system and the system of accessory axes, rendering the shuttle sometimes master and sometimes slave depending on the particular requirements and situations.

REFERENCE (1) industrial handling system with independent and coordinated shuttles, synchronous and/or asynchronous, on a power-supplied rail which integrates the permanent magnets, wherein said shuttles are made up of self-propelled sliding shoes which integrate the coils, the logic unit, the means for communication and the secondary drives, which are individually associated in a removable way with an interface equipped means to actuate the secondary drives according to the function provided by the specific application.
(2) central server;
(3) control camera, for vision system;
(10) shuttle;
(11) self-propelled sliding shoe, called slider or mover, with on-board coils;
(12) equipped interface means for the purposes of support and/or machining and for actuating the secondary drives, for example a tray.
(101) means for the transmission of power from the rail to the trolley, for example brushes;
(102) on-board coils, for the primary movement along the rail;
(103) compartment with the logic control unit, for the primary movement of the linear motor and the secondary drives, also intended to manage communication and sensors;
(104) secondary driving means of the driver units type;
(105) vacuum pump;
(106) suction cups for holding and release;
(107) tray backlighting plate;
(108) passing-through extracting means;
(109) centering pins of the tray;
(110) position sensor of the absolute encoder type;
(111) roller or ball sliding shoes of the trolley which engage in the guide;
(112) housing;
(113) variant of equipped tray with increased sizes;
(120) pin centering bushes;
(121) vacuum holding holes on the upper surface of the tray;
(122) passage holes for the extracting-lifting means;
(123) ducts for vacuum inside the tray;
(124) connection of the vacuum circuit;
(20) power-supplied rail which integrates along the path the permanent magnets for the primary movement of the shuttles, being of the bidirectional top-bottom rail type in the vertical loop configurations with lateral overturning, or even of the simple rail type for horizontal loop configurations;
(201) permanent magnets;
(202) power-supplied seat of sliding and contacting of the brushes;
(203) guide integral with the rail;
(205) overturning means, by means of rotation;
(206) overturnable section of rail;
(50a-d) handling direction in the vertical loop configuration with lateral overturning on a top-bottom bidirectional rail where (50a) is the forward direction, (50b) is the return in the opposite direction below and (50c-d) is the lateral rotation by 180° of the shuttle or overturning and (50e) is the exit after the rotation by 90° for particular working processes or replacements.

The invention claimed is:
1. Handling system with independent and coordinated shuttles, for industrial automation, being of the integrated and automated type with an electromagnetic drive linear motor wherein the shuttles are engaged to the same rail and run along it while carrying out their working mission, such as handling and/or positioning a semi-finished product or a product, according to a continuous production cycle; and wherein each shuttle incorporates advancing means for moving along said rail, with processing and control means as well, and is equipped according to the function, that is to say, it comprises own means for performing the planned mission; and wherein in said system there is the coordination of the activities of said shuttles there being included means for determining their position, means for sending and receiving information and centralized processing and control means; said handling system being characterised in that, for advancing, it uses a linear synchronous motor of the LSM moving coils type, wherein the permanent magnets are integrated in said rail to interact with the coils that are on each shuttle in such a way as to make the shuttles independent with respect to each other in their movement and in the function to be performed, and also to make them individually and arbitrarily removable from and/or addable to the system at any time of the production cycle or at any point of the path, synchronous and/or asynchronous, according to a logic of the modular type; and wherein each shuttle is connected in a wireless mode, for information transmission, whereas for power supply it can be connected by means of sliding contacts to a fixed power feeding bar or in a wireless mode by electromagnetic induction; and wherein said system includes automatic means for determining the position of each shuttle, of the type called encoder, with a fixed and integrated reference continuously along the entire path of the rail, and a reader of said reference which is mounted on each shuttle, and wherein said system comprises a centralized control and processing means, consisting of a central server which contributes to the general coordination of the system it being provided with control logic with executive programs intended to process the information received from the simultaneously active shuttles and from the sensor means; and wherein said shuttles are of the smart type and translate on the same rail in an independent but coordinated way, synchronous and/or asynchronous, each of them being made up of:
  a self-propelled sliding shoe or mover which acts as a slider constrained to said rail in a removable way and comprises all the active means for performing the advancing movements and enabling the secondary drives, according to the secondary working axes, also with the respective control and communication means; wherein each sliding shoe is autonomous and independent, including on board said coils selectively supplied and controlled for the purpose of electromagnetic drive, also with its logic control unit, sensors and means for receiving and transmitting information, each shuttle being connected wirelessly for the purpose of power supply and data transmission;
  an equipped means for actuating the secondary working drives, which is associated in a removable way with respect to said self-propelled sliding shoe being supported by it.

2. Handling system according to claim 1, characterised in that said shuttle includes a self-propelled sliding shoe comprising:
  means for receiving power supply from the rail, wirelessly, such as sliding contacts of the brushes type or without contacts for the transfer of energy by means of electromagnetic induction;
  moving coils;
  logic control unit for managing the primary movement, or motion control, along the axis of the rail and for the entire path, and the control of the secondary axes;
  driving means, or driver units, for managing the drives related to the working processes along the controlled axes further with respect to said primary movement, such as the driving of grippers and/or extracting-lifting means;
  means for making pressure or vacuum for the purposes of the working processes, for example a vacuum pump with pipes, or a pump with a Venturi device, with interface means such as contact suction cups;
  on-board circuit board for managing communication, with access ports for software update and/or for control diagnostics;
  antenna for wireless communication, for example for the update of the data and/or of the missions and/or of the positions;
  collision sensor means for preventing the collision of shuttles;
  transducer means with position sensors of the mobile reader type for the fixed, continuous and absolute reference, which is in the rail, or absolute encoders, for a micrometric control of position;
  means for proximity communication, such as systems of the optical type, with a high transmission speed, in such a way that for the fine positioning in a given position it is advantageous not to wait for the response of the conventional central wireless transmission system.

3. Handling system according to claim 2, characterised in that said shuttle includes an equipped means which is associated with said self-propelled sliding shoe in such a way as to support, transport, position the product according to the provided working processes, holding it and positioning it with micrometric precision; said equipped means being releasable upon command of said sliding shoe, upon occurrence of conditions detected or expected by the shuttle, or upon external command of said central server of coordination and control.

4. Handling system according to claim 1, characterised in that said rail comprises:
  power supply means, with a fixed line of electrical power to be transferred to the moving shuttles, in two alternative ways: by contact, with means of the brushes type, or without contact with electromagnetic induction means where, instead of the brushes, there are some receivers on the shuttles;
  fixed permanent magnets, for concatenating the magnetic flux of the linear motors of the coils on said shuttles;
  fixed magnetic line of the encoder type, for providing the position sensors on the shuttles with an absolute reference;
  signal line for data and communication transmission from and to the moving shuttles.

5. Handling system according to claim 1, characterised in that each of said shuttles acts, from time to time, as a master or as a slave, depending on the particular traffic situation or on the particular mission or also in case of specific encodings or occurred and detected accidents; and wherein each shuttle is intended to carry out simultaneously different missions such as: specific path, operating cycle, number of stops; and wherein each shuttle can carry out missions and/or operations according to assigned logics independently of whether it is moving or it is stationary, or in transit with a given law of motion in a specific section, or in the queue at a workstation or being machined in the latter.

6. Handling system according to claim 1, characterised in that said central server, of coordination and control, is provided with programs which are intended to superintend overall management, it being able to send and receive information from/to said shuttles and providing at least to: hold the details of the possible missions for said shuttles, assign missions to the single shuttles, receive progress states from the shuttles, synchronize events and operations in the workstations as well, control and store the progress of the working processes, perform overall diagnostics and manage safety devices and alarms.

7. Handling system according to claim 1, characterised in that it includes, in an alternative or combined way, the following path configurations:
  a) fixed paths or variable paths by means of switches, being allowed by said rail with permanent magnets, such as the linear configurations of the top-bottom type in the form of vertical loops with lateral overturning, simple or coupled in pairs, or for continuous loop configurations in the form of a circuit;
  b) closed or open;
  c) linear, curved or combined, that is to say, both linear and curved;
  d) consisting of only linear portions and joined to each other by the transfer of the shuttles by means of translation or overturning and/or rotation platforms;
  e) along the path there are operating stations which perform operations with the possibility of synchrony with respect to the presence or non-presence of the shuttles;
  f) articulated and with different handling planes;
  and wherein, in the case of said linear configuration of the top-bottom type a), said lateral overturning occurs with an overturning means with a rotary motor intended to overturn a whole section of the rail including guides, magnets and power supply system, in such a way that the empty shuttle engaged in it is overturned by 180° degrees and then exits, when the rotation has been completed, to take a new section of rectilinear rail placed at a lower level with respect to the forward one, which is opposite for the return to the initial station, or such as to make partial rotations such as of 90° degrees to go out on a section of rail intended for particular and/or maintenance uses.

8. Handling system according to claim 1, characterised in that it simultaneously provides, in addition to said shuttle, a configuration of a shuttle individually intended to perform diversified missions, with particular and different purposes with respect to the other shuttles of said system which carry out the production cycle, anyway maintaining the same handling and coordination logic as said system.

* * * * *